US008304165B2

(12) United States Patent
Andriessen et al.

(10) Patent No.: US 8,304,165 B2
(45) **Date of Patent: *Nov. 6, 2012**

(54) NEGATIVE WORKING, HEAT-SENSITIVE LITHOGRAPHIC PRINTING PLATE PRECURSOR

(75) Inventors: Hieronymus Andriessen, Mortsel (BE); Paul Callant, Mortsel (BE); Alexander Williamson, Mortsel (BE)

(73) Assignee: AGFA Graphics NV, Mortsel (BE)

( * ) Notice: Subject to any disclaimer, the term of this patent is extended or adjusted under 35 U.S.C. 154(b) by 660 days.

This patent is subject to a terminal disclaimer.

(21) Appl. No.: 12/439,578

(22) PCT Filed: Oct. 10, 2007

(86) PCT No.: PCT/EP2007/060780

§ 371 (c)(1),
(2), (4) Date: Mar. 2, 2009

(87) PCT Pub. No.: WO2008/046773

PCT Pub. Date: Apr. 24, 2008

(65) Prior Publication Data

US 2010/0021845 A1 Jan. 28, 2010

Related U.S. Application Data

(60) Provisional application No. 60/862,277, filed on Oct. 20, 2006.

(30) Foreign Application Priority Data

Oct. 17, 2006 (EP) .................................... 06122415

(51) Int. Cl.
*G03F 7/004* (2006.01)
*B41N 1/08* (2006.01)

(52) U.S. Cl. .................. 430/271.1; 430/270.1; 430/300; 430/302; 101/453; 101/463.1

(58) Field of Classification Search ............... 430/270.1, 430/300, 302, 944, 271.1, 275.1, 278.1; 101/453, 101/463.1

See application file for complete search history.

(56) References Cited

U.S. PATENT DOCUMENTS

| | | | | |
|---|---|---|---|---|
| 6,214,518 | B1 * | 4/2001 | Kunita et al. | 430/270.1 |
| 6,342,329 | B1 * | 1/2002 | Tsuda | 430/138 |
| 2010/0021846 | A1 * | 1/2010 | Callant et al. | 430/281.1 |

FOREIGN PATENT DOCUMENTS

| | | | |
|---|---|---|---|
| EP | 1 342 568 | A1 | 9/2003 |
| EP | 1 524 111 | A2 | 4/2005 |
| EP | 1 586 448 | * | 10/2005 |
| EP | 1 614 538 | A2 | 1/2006 |
| EP | 1 614 539 | A1 | 1/2006 |
| EP | 1 614 540 | A1 | 1/2006 |
| EP | 1 634 898 | A2 | 3/2006 |
| WO | WO 02/082438 | A2 | 10/2002 |
| WO | WO 2006/037716 | A1 | 4/2006 |
| WO | WO 2007/135142 | A1 | 11/2007 |
| WO | WO 2007/135151 | A1 | 11/2007 |

* cited by examiner

*Primary Examiner* — Anca Eoff

(74) *Attorney, Agent, or Firm* — Leydig, Voit & Mayer, Ltd.

(57) ABSTRACT

A heat-sensitive negative-working lithographic printing plate precursor comprising:

a support having a hydrophilic surface or which is provided with a hydrophilic layer; and an image-recording layer comprising hydrophobic thermoplastic polymer particles and an infrared light absorbing dye;

characterized in that:

said image-recording layer further comprises a compound, said compound comprising an aromatic moiety and at least one acidic group or salt thereof and having a most bathochromic light absorption peak at a wavelength between 300 nm and 450 nm.

4 Claims, No Drawings

NEGATIVE WORKING, HEAT-SENSITIVE LITHOGRAPHIC PRINTING PLATE PRECURSOR

CROSS-REFERENCE TO RELATED APPLICATIONS

This patent application is the U.S. national phase of International Patent Application No. PCT/EP2007/060780, filed Oct. 10, 2007, which claims the benefit of European Patent Application No. 06122415.0, filed Oct. 17, 2006, and U.S. Provisional Patent Application No. 60/862,277, filed Oct. 20, 2006, the disclosures of which are incorporated by reference herein.

FIELD OF THE INVENTION

The present invention relates to a heat-sensitive, negative-working lithographic printing plate precursor.

BACKGROUND OF THE INVENTION

Lithographic printing presses use a so-called printing master such as a printing plate which is mounted on a cylinder of the printing press. The master carries a lithographic image on its surface and a print is obtained by applying ink to said image and then transferring the ink from the master onto a receiver material, which is typically paper. In conventional, so-called "wet" lithographic printing, ink as well as an aqueous fountain solution (also called dampening liquid) are supplied to the lithographic image which consists of oleophilic (or hydrophobic, i.e. ink-accepting, water-repelling) areas as well as hydrophilic (or oleophobic, i.e. water-accepting, ink-repelling) areas. In so-called driographic printing, the lithographic image consists of ink-accepting and ink-adhesive (ink-repelling) areas and during driographic printing, only ink is supplied to the master.

Printing masters are generally obtained by the image-wise exposure and processing of an imaging material called plate precursor. In addition to the well-known photosensitive, so-called pre-sensitized plates, which are suitable for UV contact exposure through a film mask, also heat-sensitive printing plate precursors have become very popular in the late 1990s. Such thermal materials offer the advantage of daylight stability and are especially used in the so-called computer-to-plate method wherein the plate precursor is directly exposed, i.e. without the use of a film mask. The material is exposed to heat or to infrared light and the generated heat triggers a (physico-) chemical process, such as ablation, polymerization, insolubilization by cross linking of a polymer, heat-induced solubilization, or particle coagulation of a thermoplastic polymer latex.

The most popular thermal plates form an image by a heat-induced solubility difference in an alkaline developer between exposed and non-exposed areas of the coating. The coating typically comprises an oleophilic binder, e.g. a phenolic resin, of which the rate of dissolution in the developer is either reduced (negative working) or increased (positive working), by the image-wise exposure. During processing, the solubility differential leads to the removal of the non-image (non-printing) areas of the coating, thereby revealing the hydrophilic support, while the image (printing) areas of the coating remain on the support. Typical examples of such plates are described in e.g. EP-As 625 728, 823 327, 825 927, 864 420, 894 622 and 901 902. Negative working embodiments of such thermal materials often require a pre-heat step between exposure and development as described in e.g. EP-A 625 728.

Negative working plate precursors which do not require a pre-heat step may contain an image-recording layer that works by heat-induced particle coalescence of a thermoplastic polymer latex, as described in e.g. EP-As 770 494, 770 495, 770 496 and 770 497. These patents disclose a method for making a lithographic printing plate comprising the steps of (1) image-wise exposing an imaging element comprising hydrophobic thermoplastic polymer particles dispersed in a hydrophilic binder and a compound capable of converting light into heat and (2) developing the image-wise exposed element by applying fountain and/or ink.

EP-A 1 342 568 describes a method of making a lithographic printing plate comprising the steps of (1) image-wise exposing an imaging element comprising hydrophobic thermoplastic polymer particles dispersed in a hydrophilic binder and a compound capable of converting light into heat and (2) developing the image-wise exposed element by applying a gum solution, thereby removing non-exposed areas of the coating from the support.

WO2006/037716 describes a method for preparing a lithographic printing plate which comprises the steps of (1) image-wise exposing an imaging element comprising hydrophobic thermoplastic polymer particles dispersed in a hydrophilic binder and a compound capable of converting light into heat and (2) developing the image-wise exposed element by applying a gum solution, thereby removing non-exposed areas of the coating from the support and characterized by an average particle size of the thermoplastic polymer particles between 40 nm and 63 nm and wherein the amount of the hydrophobic thermoplastic polymer particles is more than 70% and less than 85% by weight, relative to the image recording layer.

EP-A 1 614 538 describes a negative working lithographic printing plate precursor which comprises a support having a hydrophilic surface or which is provided with a hydrophilic layer and a coating provided thereon, the coating comprising an image-recording layer which comprises hydrophobic thermoplastic polymer particles and a hydrophilic binder, characterized in that the hydrophobic thermoplastic polymer particles have an average particle size in the range from 45 nm to 63 nm and wherein the amount of the hydrophobic thermoplastic polymer particles in the image-recording layer is at least 70% by weight relative to the image-recording layer.

EP-A 1 614 539 and EP-A 1 614 540 describes a method of making a lithographic printing plate comprising the steps of (1) image-wise exposing an imaging element as disclosed in EP-A 1 614 538 and (2) developing the image-wise exposed element by applying an aqueous, alkaline solution.

A first problem associated with negative-working printing plates that work according to the mechanism of heat-induced latex-coalescence is the complete removal of the non-exposed areas during the development step (i.e. clean-out). An insufficient clean-out may result in toning on the press, i.e. an undesirable increased tendency of ink-acceptance in the non-image areas. This clean-out problem tends to become worse when the particle diameter of the thermoplastic particles used in the printing plate decreases, as mentioned in EP-As 1 614 538, 1 614 539, 1 614 540 and WO2006/037716.

A decrease of the particle diameter of the hydrophobic thermoplastic particles in the imaging layer may however further increase the sensitivity of the printing plate precursor. The rather low sensitivity of negative-working printing plates that work according to the mechanism of heat-induced latex-coalescence is a second problem to be solved. A printing plate precursor characterized by a low sensitivity needs a longer exposure time and therefore results in a lower throughput (i.e. lower number of printing plate precursors that can be exposed in a given time interval).

According to the unpublished EP-A 06 114 473 (filed 2006 May 24) a good clean out is obtained, even with printing plate precursors comprising thermoplastic particles having an average particle diameter of less than 40 nm, when the amount of infrared light absorbing dye, without taking into account an optional counterion, is more than 0.80 mg per $m^2$ of the total surface of the hydrophobic particles. According to the unpublished EP-A 06 114 475 (filed 2006 May 24) a good clean-out is obtained when said amount of infrared light absorbing dye is more than 0.70 mg per $m^2$ of the total surface of the hydrophobic particles, when the precursor is developed in an alkaline developer. A possible disadvantage of this invention may be a too high absorption of infrared light by the coating, due to the high amount of infrared light absorbing dye present in the image-recording layer, resulting in a low sensitivity.

SUMMARY OF THE INVENTION

In one aspect, the present invention provides a heat-sensitive negative-working lithographic printing plate precursor comprising:

- a support having a hydrophilic surface or which is provided with a hydrophilic layer and;
- an image-recording layer comprising hydrophobic thermoplastic polymer particles and an infrared light absorbing dye, wherein said image-recording layer further comprises a compound, said compound comprising an aromatic moiety and at least one acidic group or salt thereof and having a most bathochromic light absorption peak at a wavelength between 300 nm and 450 nm.

DETAILED DESCRIPTION OF THE INVENTION

The heat-sensitive printing plate precursor comprises a support and a coating. The coating may comprise one or more layer(s). The layer of said coating comprising the hydrophobic thermoplastic particles is referred to as the image-recording layer. Said image-recording layer further comprises an infrared light absorbing dye and a compound, said compound comprising an aromatic moiety and at least one acidic group or salt thereof and having a most bathochromic light absorption peak at a wavelength between 300 nm and 450 nm. The infrared light absorbing dye is hereinafter called the IR-dye.

Said compound comprises at least one acidic group or salt thereof. The acidic groups are preferably selected from the list consisting of:

- a substituted sulphonamido acid group;
  ($-SO_2NHCOR^g$, $-SO_2NHSO_2R^g$, $-CONHSO_2R^g$)
- a carboxylic acid group ($-COOH$);
- a sulphonic acid group ($-SO_3H$);
- a dithiosulphonic acid group ($-SSO_3H$);
- a sulphuric acid group ($-OSO_3H$);
- a phosphoric acid group ($-OPO_3H_2$);
- a phosphonic acid group ($-PO_3H_2$);

wherein each $R^g$ independently represents a hydrocarbon group which may have a substituent. Preferably the acidic group is a sulphonic acid group.

Said compound comprises one or more aromatic moieties. The aromatic moiety may be an aryl (e.g. phenyl, naphthyl) or heteroaryl (e.g. imidazole, benzimidazole, thiazole, benzothiazole, oxazole, benzoxazole, indolenine, quinoline) group. Preferably said compound is a cyanine, azacyanine, merocyanine or merostyryl dye, comprising at least one acidic group or salt thereof. The acidic group, or salt thereof, is linked to the aromatic moiety by means of a linking group. The linking group is preferably a divalent linking group. More preferably the divalent linking group is an optionally substituted alkylene or (hetero)arylene group. Most preferably the divalent linking group is an alkylene group.

In a preferred embodiment said compound is a cyanine or azacyanine dye according to Formulae I-a or I-b Formula I-a

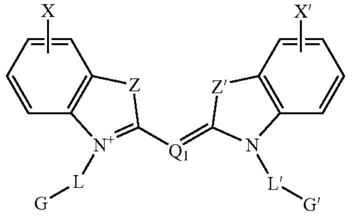

Formula I-b

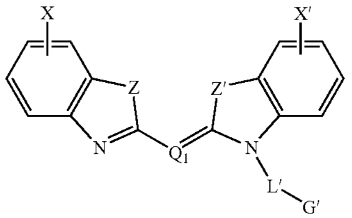

wherein $Q_1$ represents CH or N;

Z and Z' independently represent O, NR', S, $C(CH_3)_2$ or CH═CH wherein R' is an optionally substituted alkyl or (hetero)aryl group;

X and X' independently represent hydrogen, halogen, $O-CH_3$, an optionally substituted alkyl or (hetero) aryl group or a condensed benzene ring;

L and L' represent a linking group;

G and G' represent an acidic group or salt thereof.

To obtain an electrically neutral molecule in Formulae I-a and I-b one or more monovalent positive counter ion(s), as described above, may be present.

In a more preferred embodiment, said compound is a cyanine or azacyanine dye according to Formulae I-c or I-d Formula I-c

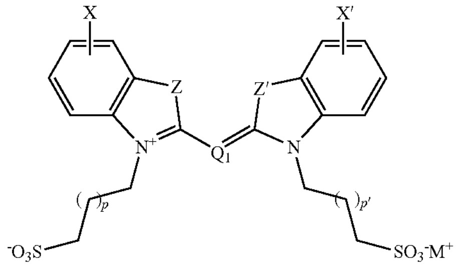

-continued

Formula I-d

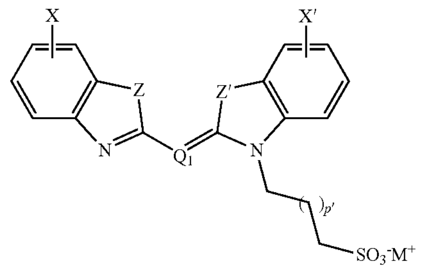

wherein p and p' are integers ranging from 0 to 3;

$Q_1$, X, X', Z, Z' have the same meaning as in Formulae I-a or I-b;

$M^+$ is a monovalent positive counter ion.

In a most preferred embodiment said compound is a cyanine dye according to Formula I-e Formula I-e

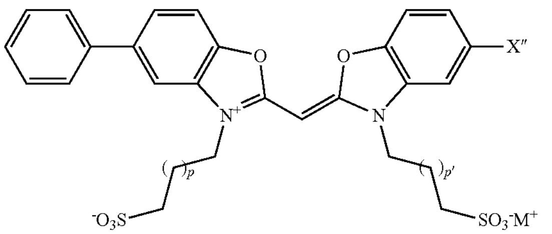

wherein p and p' are integers ranging from 0 to 3;

X" represents H, O—$CH_3$, chloride or phenyl;

$M^+$ is a monovalent counter ion.

In another preferred embodiment said compound is a merocyanine dye according to Formulae II-a, II-b or II-c.

Formula II-a

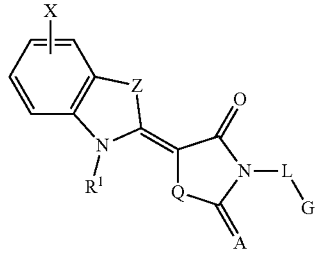

Formula II-b

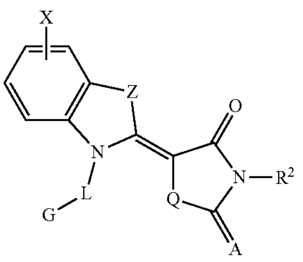

-continued

Formula II-c

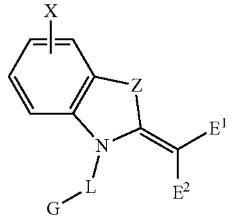

wherein

X, Z, L, G have the same meaning as described in Formulae I-a or I-b;

$R^1$ and $R^2$ independently represent an optionally substituted alkyl or (hetero)aryl group;

$E^1$ and $E^2$ independently represent hydrogen, CN, $COR^3$, $CO_2R^4$, $CONR^5R^6$ wherein at least one E is not a H-atom and wherein $R^3$ and $R^4$ independently represent an optionally substituted alkyl or (hetero)aryl group and $R^5$ and $R^6$ independently represent hydrogen, an optionally substituted alkyl or (hetero)aryl group;

Q represents O, S, $NR^7$ or $CONR^5$ wherein $R^7$ is an optionally substituted alkyl, benzyl or phenyl group and $R^5$ is as described above;

A represents O or S.

To obtain an electrically neutral molecule in Formulae II-a, II-b and II-c one or more monovalent positive counter ion(s), as described above, may be present.

In a more preferred embodiment said compound is a merocyanine dye according to Formulae II-d, II-e or II-f.

Formula II-d

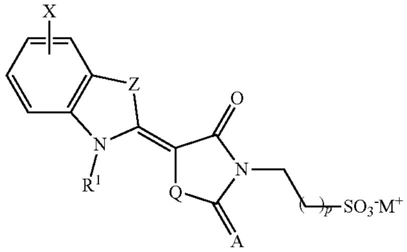

Formula II-e

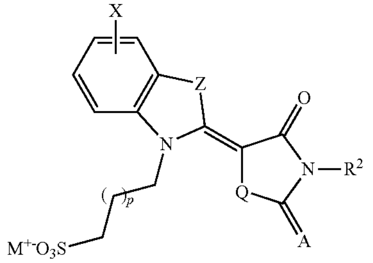

Formula II-f

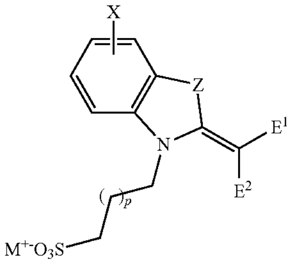

wherein $R^1$, $R^2$, Q, A, X, Z, $E^1$ and $E^2$ have the meaning as described in formulae II-a, II-b or II-c;

$M^+$ is a monovalent positive counter ion;

p is an integer ranging from 0 to 3.

In another preferred embodiment said compound is a (mero)styryl dye according to Formula III-a, III-b, III-c, III-d, III-e or III-f.

Formula III-a

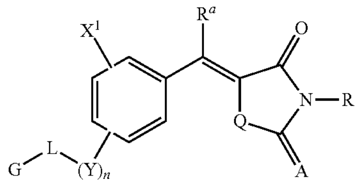

Formula III-b

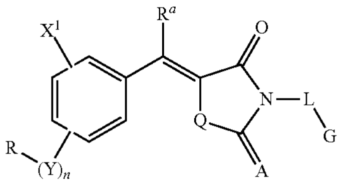

Formula III-c

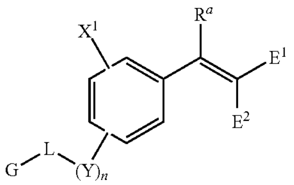

Formula III-d

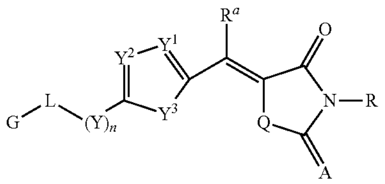

Formula III-e

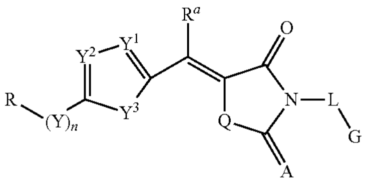

Formula III-f

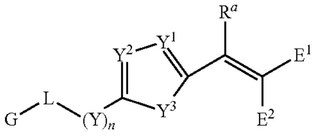

wherein

R represents an optionally substituted alkyl or (hetero)aryl group;

$R^a$ represents hydrogen or an optionally substituted alkyl or (hetero)aryl group;

$X^1$ represents hydrogen, O-Me, methyl or a condensed benzene ring;

G and G' have the same meaning as in Formula I-a;

A, Q, $R^7$, $E^1$, $E^2$, $R^3$, $R^4$, $R^5$ and $R^6$ have the same meaning as in formulae II-a, II-b or II-c;

n is 0 or 1;

Y represents O, S or $NR^7$, wherein $R^7$ is as described above;

$Y^1$, $Y^2$ independently represent N or CH;

$Y^3$ represents O, S or $NR^7$, wherein $R^7$ is as described above.

To obtain an electrically neutral molecule in Formulae III-a, III-b, III-c, III-d, III-e and III-f one or more monovalent positive counter ion(s), as described above, may be present.

More preferably said compound is a (mero) styryl dye according to Formulae III-g, III-h, III-i, III-j, III-k or III-l Formula III-g

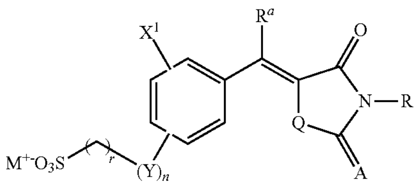

Formula III-h

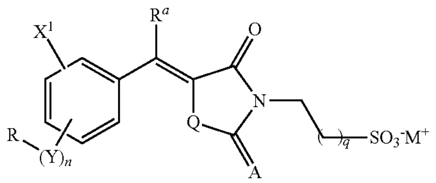

Formula III-i

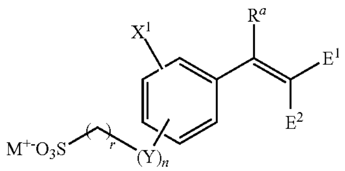

Formula III-j

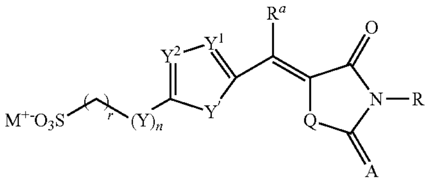

Formula III-k

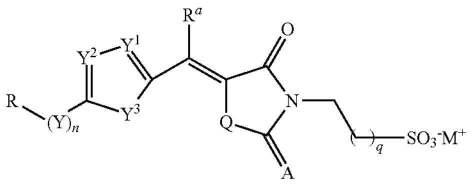

Formula III-l

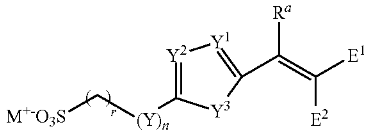

wherein q is an integer ranging from 1 to 3, r is an integer ranging from 0 to 3 and n is 0 or 1;

R, Y, $Y^1$, $Y^2$, $Y^3$, $R^a$, Q, A, $E^1$, $E^2$ have the same meaning as in Formulae III-a, III-b, III-c, III-d, III-e and III-f;

$M^+$ represents a monovalent positive counter ion.

Other compounds that can be used in the present invention are the so-called fluorescent brighteners as described in e.g. "Color Chemistry" Third edition (2003) H. Zollinger p. 365-377, "Industrial Dyes" (2003) K. Hunger p. 585-624 and U.S.

Pat. No. 6,232,052. Fluorescent brighteners according to Formulae IV-a, IV-b and IV-c may be used as UV-dye in the present invention.

Formula IV-a

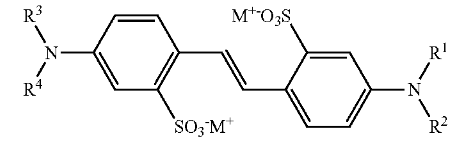

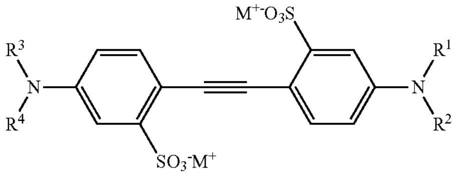

Formula IV-b

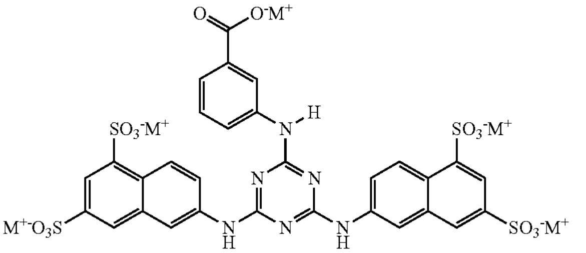

Formula IV-c

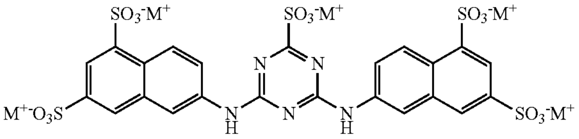

wherein $R^1$, $R^2$, $R^3$, $R^4$ are independently an optionally substituted alkyl or (hetero)aryl group and $M^+$ is a cation.

The synthesis of cyanine, merocyanine and (mero)styryl dyes is described in for example "The Chemistry of heterocyclic compounds; The cyanine dyes and related compounds", by F. M. Hamer from Wiley & Sons, 1964, page 58 and page 534.

The synthesis and examples of azacyanine dyes is found in e.g. U.S. Pat. No. 3,130,197, EP 0 890 873 and WO2002/082438.

More than one of said compounds, comprising an aromatic moiety and at least one acidic group, or salt thereof, and having a most bathochromic absorption peak between 300 nm and 450 nm, may be used in the present invention.

Said compound has a most bathochromic absorption peak between 300 nm and 450 nm. Said compound may have multiple absorption peaks, provided that the most bathochromic peak is situated between 300 nm and 450 nm. Preferably said compound has a most bathochromic absorption peak between 325 nm and 450 nm, more preferably between 350 nm and 450 nm. Preferably said compound has a most bathochromic absorption peak at a wavelength ($\lambda_{max}$) lower than or equal to 425 nm and the ratio of the absorption at $\lambda_{max}$ ($A(\lambda_{max})$) to the absorption at 450 nm ($A(\lambda_{450})$) is more than 7.5, preferably more than 10, most preferably more than 20.

A too high absorption in the visible wavelength region (451 nm to 750 nm) would result in a coloration of the image-recording layer and therefore, in the on-press development embodiment of the present invention, may diminish the visibility of the print-out image, said print-out image preferably being formed upon image-wise infrared light, hereinafter also referred to as IR-light, exposure of the image-recording layer comprising infrared light absorbing dyes, hereinafter also referred to as IR-dyes, capable of forming a print-out image upon IR-light exposure.

A too strong absorption in the IR wavelength region (751 nm to 1500 nm) may adversably influence the sensitivity of the lithographic printing plate precursor. If the IR-light absorption of the image-recording layer becomes too high, a higher exposure may be necessary for inducing coalescence of the thermoplastic particles near the support, resulting in a lower throughput, i.e. lower number of printing plate precursors that can be exposed in a given time interval.

In table 1 some examples of said compound are shown. In table 1, besides the chemical structure, the wavelength of the most bathochromic absorption peak ($\lambda_{max}$), the absorption at $\lambda_{max}$($A(\lambda_{max})$), the absorption at 450 nm ($A(\lambda_{450})$) and the ratio between both absorptions $A(\lambda_{max})/A(\lambda_{450})$ of said compounds, dissolved in methanol, are given.

TABLE 1

Chemical structure and absorption characteristics of compounds according to this invention.

| | $\lambda_{max}$ (nm) | A ($\lambda_{max}$) | A ($\lambda_{450}$) | $A(\lambda_{max})/A(\lambda_{450})$ |
|---|---|---|---|---|
| 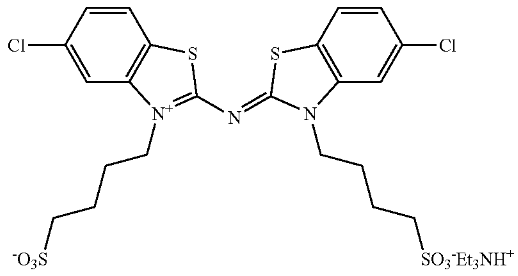 | 382 | 1.789 | 0.007 | 255 |

TABLE 1-continued
Chemical structure and absorption characteristics of compounds according to this invention.
| | $\lambda_{max}$ (nm) | A ($\lambda_{max}$) | A ($\lambda_{450}$) | A($\lambda_{max}$)/ A($\lambda_{450}$) |
|---|---|---|---|---|
| 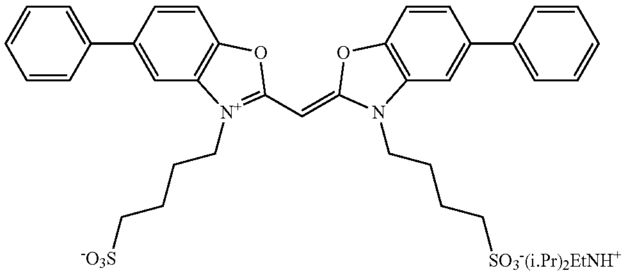 | 389 | 0.973 | $3.7 \cdot 10^{-5}$ | 26155 |
| 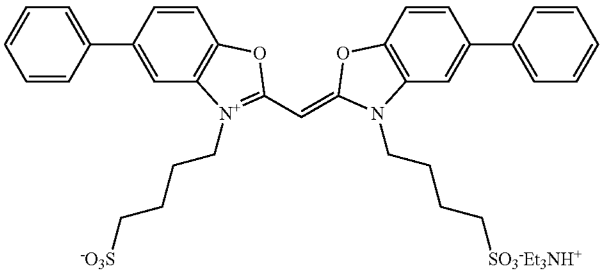 | 390 | 1.642 | 0.003 | 547 |
| 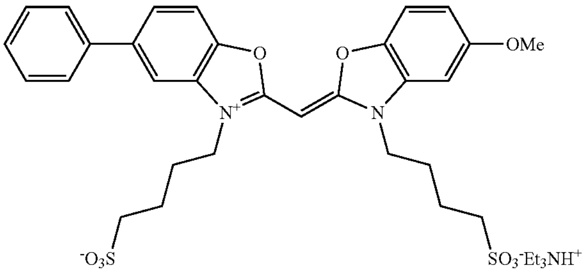 | 392 | 2.000 | 0.004 | 500 |
| 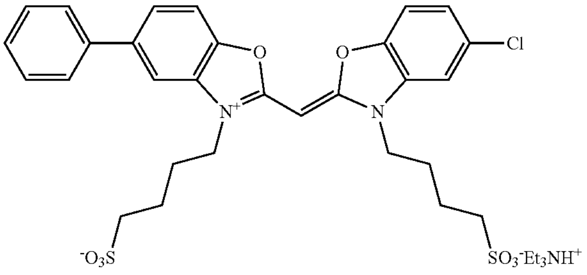 | 386 | 2.137 | 0.007 | 305 |
| 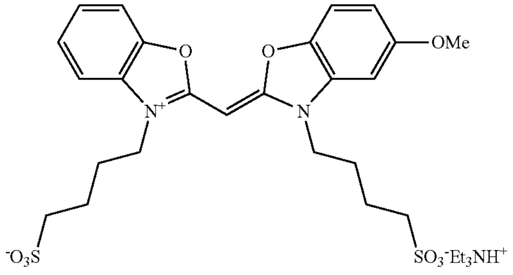 | 384 | 1.895 | 0.0009 | 2082 |

TABLE 1-continued
Chemical structure and absorption characteristics of compounds according to this invention.
| | $\lambda_{max}$ (nm) | A ($\lambda_{max}$) | A ($\lambda_{450}$) | A($\lambda_{max}$)/ A($\lambda_{450}$) |
|---|---|---|---|---|
| 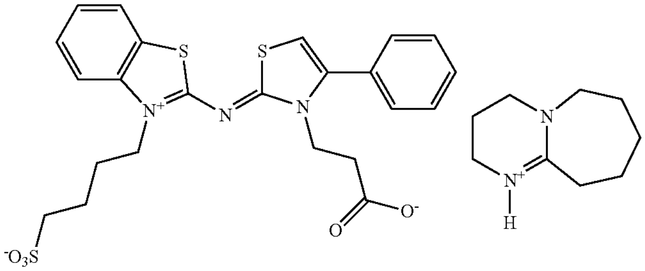 | 369 | 0.957 | 0.0011 | 846 |
| 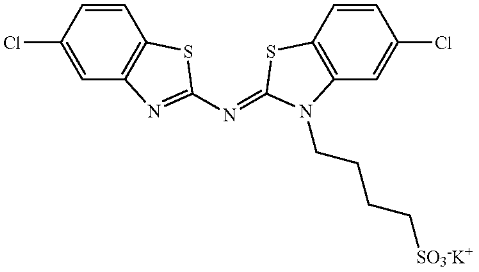 | 353 | 1.098 | 0.0013 | 807 |
| 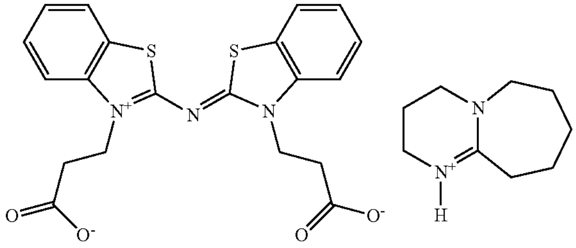 | 379 | 0.949 | 0.0188 | 50 |
| 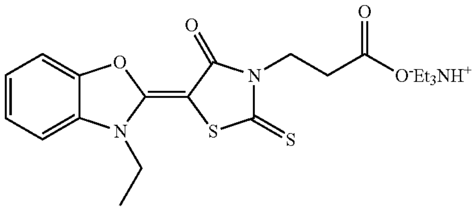 | 410 | 1.908 | 0.0039 | 482 |
| 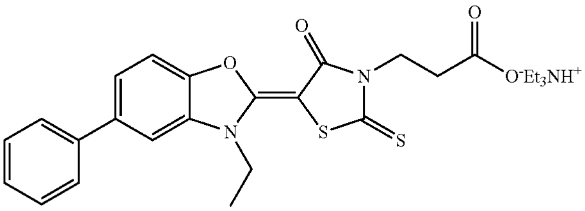 | 413 | 1.016 | 0.0026 | 389 |
| 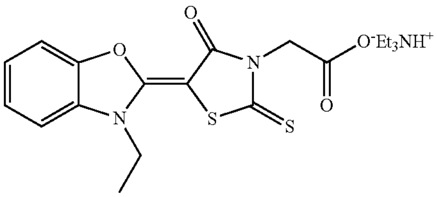 | 407 | 1.399 | 0.0024 | 584 |

TABLE 1-continued

Chemical structure and absorption characteristics of compounds according to this invention.

| | $\lambda_{max}$ (nm) | A ($\lambda_{max}$) | A ($\lambda_{450}$) | A($\lambda_{max}$)/ A($\lambda_{450}$) |
|---|---|---|---|---|
| 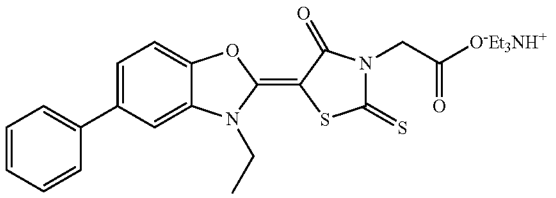 | 412 | 0.786 | 0.0020 | 389 |
| 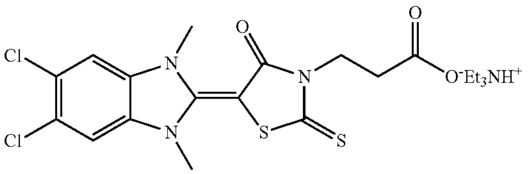 | 422 | 0.420 | 0.0516 | 8 |
| 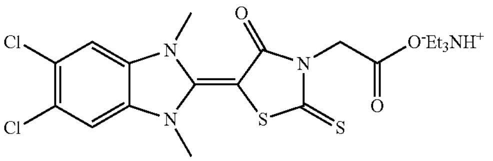 | 422 | 0.905 | 0.0980 | 9 |
| 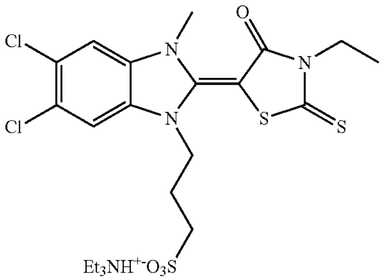 | 424 | 0.687 | 0.0860 | 8 |

In Table 1, Me=methyl, Et=ethyl, i.Pr=isopropyl.

The absorption spectra of said compounds, dissolved in methanol, were measured with a Agilent 8453 Spectrophotometer, from Agilent Technologies. The concentration of the compounds, dissolved in methanol, was adjusted to obtain an absorption at $\lambda_{max}$ between 0.25 and 2.5.

In centrifugation experiments with solutions containing hydrophobic thermoplastic particles (0.1 to 5.0 wt. %) and one of the compounds from table 1, it has been observed that these compounds, at least partially, co-sediment with the hydrophobic thermoplastic particles. In these experiments, centrifugation conditions of 40 000 to 60 000 rpm for 1 to 4 hours were used, in order to achieve sedimention of all particles. As a reference experiment, a solution of the compounds from table 1, without hydrophobic particles, was centrifuged under the same conditions. Comparison with UV-VIS spectroscopy of both supernatent solutions revealed that all compounds from table 1 were, at least partially, co-sedimented with the particles.

The image-recording layer further comprises a dye which absorbs IR-light and converts the absorbed energy into heat. Preferred IR-dyes are cyanine, merocyanine, indoaniline, oxonol, pyrilium and squarilium dyes. Examples of suitable IR-dyes are described in e.g. EP-As 823 327, 978 376, 1 029 667, 1 053 868 and 1 093 934 and WOs 97/39894 and 00/29214.

Other preferred IR-dyes are described in EP 1 614 541 (page 20 line 25 to page 44 line 29) and the unpublished EP-A 05 105 440 (filed 2005 Jun. 21) and PCT/EP2006/063327 (filed 2006 Jun. 20). These IR-dyes are particularly preferred in the on-press development embodiment of this invention since these dyes give rise to a print-out image after exposure to IR-light, prior to development on press.

The printing plate precursor according to the present invention comprising hydrophobic thermoplastic particles, an IR-dye and a compound, said compound comprising an aromatic moiety and at least one acidic group or salt thereof and having a most bathochromic light absorption peak at a wavelength between 300 nm and 450 nm, in the image-recording, is characterized by an improved clean-out. A possible explanation of this phenomenon may be that all or part of the IR-dye and said compound adsorb on the surface of the hydrophobic particles and render the particles more dispersible in aqueous solutions (e.g. fountain solution or the developing solution). An optimal interaction between said compound and the hydrophobic particles, resulting in an improved clean-out, may be achieved by selecting the compounds as described above.

Depending on the method used to develop the exposed printing plate precursors, different amounts of IR-dye and said compound may be used. Since it is believed that optional counter ions of the IR-dyes and said compounds (i.e. when the IR-dyes and/or said compounds are used as salts) do not have an essential contribution to the invention, the amount of IR-dye and said compound(s) referred to in the description, examples and the claims, is meant to be the amount of IR-dye and said compound without taking into account optional counter ions.

The sum of the amounts of IR-dye(s) and said compound (s), without taking into account optional counter ions, is preferably more than 0.70 mg, more preferably more than 0.80 mg and most preferably more than 1.00 mg per $m^2$ of the total surface of said thermoplastic polymer particles.

There are no particular limitations concerning the ratio between IR-dye and said compound. However, when the amount of IR-dye becomes too low, the sensitivity of the precursor may decrease. Therefore, the amount of IR-dye, without taking into account optional counter ions, is preferably more than 0.25 mg, more preferably more than 0.35 mg, most preferably more than 0.45 mg per $m^2$ of the total surface of said thermoplastic polymer particles. When the amount of IR-dye becomes too high, the total infrared optical density (e.g. at 830 nm) of the coating may become too high, again resulting in a possible decrease of the sensitivity. The maximum optical density at 830 nm of the coating, obtained from diffuse reflectance spectra, measured with a Shimadzu UV-3101 PC/ISR-3100 spectrophotometer, is preferably less than 2.00, more preferably less than 1.50, most preferably less than 1.25.

Hydrophobic Thermoplastic Particles

The hydrophobic particles preferably have an average particle diameter from 15 nm to 75 nm, more preferably from 25 to 55 nm, most preferably from 35 nm to 45 nm. The average particle diameter referred to in the claims and the description of this application is meant to be the average particle diameter measured by Photon Correlation Spectrometry ($Ø_{PCS}$), also known as Quasi-Elastic or Dynamic Light-Scattering, unless otherwise specified. The measurements were performed according the ISO 13321 procedure (first edition, 1996 Jul. 1) with a Brookhaven BI-90 analyzer, commercially available from Brookhaven Instrument Company, Holtsville, N.Y., USA.

A method to measure the specific surface of the hydrophobic particles is based on hydrodynamic fractionation. With this technique a volume distribution of the particles is obtained from which an volume average particle diameter is calculated ($Ø_V$). In the examples the volume average particle diameter, measured according to this technique, is obtained with a PL-PSDA apparatus (Polymeric Laboratories Particle Size Diameter Analyser) from Polymeric Labs. From the volume distribution, obtained with the PL-PSDA apparatus, the total surface of the hydrophobic particles (expressed as square metre per gram hydrophobic particles, $m^2/g$) can be calculated. In these calculations the density ($g/cm^3$) of the thermoplastic particles has to be taken into account. The density of different polymers can be found for example in the handbook “Properties of polymers, their estimation and correlation with chemical structures” by D. W. Van Krevelen, from Elsevier Scientific publishing company, second edition, page 574-581. Alternatively, the density of the hydrophobic particles may be measured. For particles or lattices, the so-called skeletal (definition according to ASTM D3766 standard) density may be measured according to the gas displacement method.

The amount of hydrophobic thermoplastic polymer particles is preferably at least 50, more preferably at least 60, most preferably at least 70% by weight relative to the weight of all the ingredients in the image-recording layer.

The hydrophobic thermoplastic polymer particles which are present in the coating may be selected from polyethylene, poly(vinyl)chloride, polymethyl(meth)acrylate, polyethyl (meth)acrylate, polyvinylidene chloride, poly(meth)acrylonitrile, polyvinylcarbazole, polystyrene or copolymers thereof.

According to a preferred embodiment, the thermoplastic polymer particles comprise polystyrene or derivatives thereof, mixtures comprising polystyrene and poly(meth) acrylonitrile or derivatives thereof, or copolymers comprising styrene and (meth)acrylonitrile or derivatives thereof. The latter copolymers may comprise at least 30% by weight of polystyrene, more preferably at least 50% by weight of polystyrene. In order to obtain sufficient resistivity towards organic chemicals such as hydrocarbons used in e.g. plate cleaners, the thermoplastic polymer particles preferably comprise at least 5% by weight, more preferably at least 30% by weight, of nitrogen containing units, such as (meth)acrylonitrile, as described in EP-A 1 219 416. According to the most preferred embodiment, the thermoplastic polymer particles consist essentially of styrene and acrylonitrile units in a weight ratio between 1:1 and 5:1 (styrene:acrylonitrile), e.g. in a 2:1 ratio.

The thermoplastic polymer particles comprise preferably a polymer or co-polymer having a weight average molecular weight ranging from 5 000 to 1 000 000 g/mol.

The hydrophobic thermoplastic polymer particles can be prepared by addition polymerization or by condensation polymerization. They are preferably applied onto the lithographic base in the form of a dispersion in an aqueous coating liquid. These water based dispersions can be prepared by polymerization in a water-based system e.g. by free-radical emulsion polymerization as described in U.S. Pat. No. 3,476,937 or EP-A 1 217 010 or by means of dispersing techniques of the water-insoluble polymers into water. Another method for preparing an aqueous dispersion of the thermoplastic polymer particles comprises (1) dissolving the hydrophobic thermoplastic polymer in an organic water immiscible solvent, (2) dispersing the thus obtained solution in water or in an aqueous medium and (3) removing the organic solvent by evaporation.

Emulsion polymerization is typically carried out through controlled addition of several components—i.e. vinyl monomers, surfactants (dispersion aids), initiators and optionally other components such as buffers or protective colloids—to a continuous medium, usually water. The resulting polymer of the emulsion polymerization is a dispersion of discrete particles in water. The surfactants or dispersion aids which are present in the reaction medium have a multiple role in the emulsion polymerization: (1) they reduce the interfacial tension between the monomers and the aqueous phase, (2) they provide reaction sites through micelle formation in which the polymerization occurs and (3) they stabilize the growing polymer particles and ultimately the latex emulsion. The surfactants are adsorbed at the water/polymer interface and thereby prevent coagulation of the fine polymer particles. Non-ionic, cationic and anionic surfactants may be used in emulsion polymerization. Preferably non-ionic and anionic surfactants are used. Most preferably the hydrophobic thermoplastic particles are stabilized with an anionic dispersion aid. Specific examples of suitable anionic dispersion aids include sodium lauryl sulphate, sodium lauryl ether sulphate, sodium dodecyl sulphate, sodium dodecyl benzene sulphonate and sodium lauryl phosphate; suitable non-ionic dispersion aids are for example ethoxylated lauryl alcohol and ethoxylated octyl- or nonyl phenol.

Binder

The image-recording layer may further comprise a hydrophilic binder. Examples of suitable hydrophilic binders are homopolymers and copolymers of vinyl alcohol, (meth)acrylamide, methylol (meth)acrylamide, (meth)acrylic acid, hydroxyethyl (meth)acrylate, and maleic anhydride/vinylmethylether copolymers, copolymers of (meth)acrylic acid or vinylalcohol with styrene sulphonic acid.

Preferably the hydrophilic binder comprises polyvinylalcohol or polyacrylic acid.

The amount of hydrophilic binder may be between 2.5 and 50, preferably between 5 and 25, more preferably between 10 and 15% by weight relative to the total weight of all ingredients of the image-recording layer.

The amount of the hydrophobic thermoplastic polymer particles relative to the amount of the binder is preferably between 2 and 15, more preferably between 4 and 10, most preferably between 5 and 7.5.

Contrast Dyes

Colorants, such as dyes or pigments, which provide a visible color to the coating and remain in the exposed areas of the coating after the processing step may be added to the coating. The image-areas, which are not removed during the processing step, form a visible image on the printing plate and examination of the litho-graphic image on the developed printing plate becomes feasible.

Typical examples of such contrast dyes are derivatives of amino-substituted tri- or diarylmethane dyes. Dyes which, combined with specific additives, only slightly color the coating but which become intensively colored after exposure, as described in for example WO2006/005688 may also be used as colorants.

In the on-press development embodiment of this invention it is however preferred not to add contrast dyes to the image-recording layer.

Other Ingredients

Optionally, the coating may further contain additional ingredients. These ingredients may be present in the image-recording layer or in an optional other layer. For example, additional binders, polymer particles such as matting agents and spacers, surfactants such as perfluoro-surfactants, silicon or titanium dioxide particles, development inhibitors, development accelerators, and metal complexing agents are well-known components of lithographic coatings.

Preferably the image-recording layer comprises an organic compound, characterized in that said organic compound comprises at least one phosphonic acid group or at least one phosphoric acid group or a salt thereof, as described in the unpublished European Patent Application 05 109 781 (filed 2005 Oct. 20). In a particularly preferred embodiment the image-recording layer comprises an organic compound as represented by Formula VI:

Formula VI

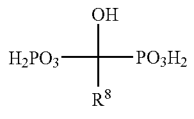

or a salt thereof and wherein $R^8$ independently represent hydrogen, an optionally substituted straight, branched, cyclic or heterocyclic alkyl group or an optionally substituted aryl or (hetero)aryl group.

Compounds according to Formula VI may be present in the image-recording layer in an amount between 0.05 and 15, preferably between 0.5 and 10, more preferably between 1 and 5% by weight relative to the total weight of the ingredients of the image-recording layer.

Optional Layers of the Coating

To protect the surface of the coating, in particular from mechanical damage, a protective layer may optionally be applied on top of the image-recording layer. The protective layer generally comprises at least one water-soluble polymeric binder, such as polyvinyl alcohol, polyvinylpyrrolidone, partially hydrolyzed polyvinyl acetates, gelatin, carbohydrates or hydroxyethylcellulose. The protective layer may contain small amounts, i.e. less than 5 percent by weight, of organic solvents. The thickness of the protective layer is not particularly limited but preferably is up to 5.0 μm, more preferably from 0.05 to 3.0 μm, particularly preferably from 0.10 to 1.0 μm.

The coating may further contain other additional layer(s) such as for example an adhesion-improving layer located between the image-recording layer and the support.

Support

The support of the lithographic printing plate precursor has a hydrophilic surface or is provided with a hydrophilic layer. The support may be a sheet-like material such as a plate or it may be a cylindrical element such as a sleeve which can be slid around a print cylinder of a printing press.

In one embodiment of the invention the support is a metal support such as aluminum or stainless steel. The support can also be a laminate comprising an aluminum foil and a plastic layer, e.g. polyester film. A particularly preferred lithographic support is an aluminum support. Any known and widely used aluminum materials can be used. The aluminum support has a thickness of about 0.1-0.6 mm. However, this thickness can be changed appropriately depending on the size of the printing plate used and the plate-setters on which the printing plate precursors are exposed.

To optimize the lithographic properties, the aluminum support is subjected to several treatments well known in the art such as for example: degrease, surface roughening, etching, anodization, sealing, surface treatment. In between such treatments, a neutralization treatment is often carried out. A detailed description of these treatments can be found in e.g. EP-As 1 142 707, 1 564 020 and 1 614 538.

A preferred aluminum substrate, characterized by an arithmetical mean center-line roughness Ra less than 0.45μ is described in EP 1 356 926.

Optimizing the pore diameter and distribution thereof of the grained and anodized aluminum surface may enhance the press life of the printing plate and may improve the toning behaviour. An optimal ratio between pore diameter of the surface of the aluminum support and the average particle diameter of the hydrophobic thermoplastic particles may enhance the press run length of the plate and may improve the toning behaviour of the prints. This ratio of the average pore diameter of the surface of the aluminum support to the average particle diameter of the thermoplastic particles present in the image-recording layer of the coating preferably ranges from 0.1:1 to 1.0:1, more preferably from 0.30:1 to 0.80:1.

Alternative supports for the plate precursor can also be used, such as amorphous metallic alloys (metallic glasses). Such amorphous metallic alloys can be used as such or joined with other non-amorphous metals such as aluminum. Examples of amorphous metallic alloys are described in U.S. Pat. Nos. 5,288,344, 5,368,659, 5,618,359, 5,735,975, 5,250, 124, 5,032,196, 6,325,868, and 6,818,078. The following references describe the science of amorphous metals in much more detail and are incorporated as references: Introduction to the Theory of Amorphous Metals, N. P. Kovalenko et al.

(2001); Atomic Ordering in Liquid and Amorphous Metals, S. I. Popel, et al; Physics of Amorphous Metals, N. P. Kovalenko et al (2001).

According to another embodiment, the support can also be a flexible support, which is provided with a hydrophilic layer. The flexible support is e.g. paper, plastic film, thin aluminum or a laminate thereof. Preferred examples of plastic film are poly-ethylene terephthalate film, polyethylene naphthalate film, cellulose acetate film, polystyrene film, polycarbonate film, etc. The plastic film support may be opaque or transparent. Particular examples of suitable hydrophilic layers that may be supplied to a flexible support for use in accordance with the present invention are disclosed in EP-A 601 240, GB 1 419 512, FR 2 300 354, U.S. Pat. No. 3,971,660, U.S. Pat. No. 4,284,705, EP 1 614 538, EP 1 564 020 and US 2006/0019196.

Exposure

The printing plate precursor is image-wise exposed with IR-light, preferably near IR-light. The IR-light is converted into heat by an IR-dye as discussed above. The heat-sensitive lithographic printing plate precursor of the present invention is preferably not sensitive to visible light. Most preferably, the coating is not sensitive to ambient daylight, i.e. visible (400-750 nm) and near UV light (300-400 nm) at an intensity and exposure time corresponding to normal working conditions so that the material can be handled without the need for a safe light environment.

The printing plate precursors of the present invention can be exposed to IR-light by means of e.g. LEDs or an infrared laser. Preferably lasers, emitting near IR-light having a wavelength in the range from about 700 to about 1500 nm, e.g. a semiconductor laser diode, a Nd:YAG or a Nd:YLF laser, are used. Most preferably, a laser emitting in the range between 780 and 830 nm is used. The required laser power depends on the sensitivity of the image-recording layer, the pixel dwell time of the laser beam, which is determined by the spot diameter (typical value of modern plate-setters at $1/e^2$ of maximum intensity: 10-25 μm) and the scan speed, and the resolution of the exposure apparatus (i.e. the number of addressable pixels per unit of linear distance, often expressed in dots per inch or dpi; typical value: 1000-4000 dpi).

Two types of laser-exposure apparatuses are commonly used: internal (ITD) and external drum (XTD) plate-setters. ITD plate-setters for thermal plates are typically characterized by a very high scan speed up to 1500 m/sec and may require a laser power of several Watts. The Agfa Galileo T (trademark of Agfa Gevaert N.V.) is a typical example of a plate-setter using the ITD-technology. XTD plate-setters for thermal plates having a typical laser power from about 20 mW to about 500 mW operate at a lower scan speed, e.g. from 0.1 to 20 m/sec. The Agfa Xcalibur, Accento and Avalon platesetter families (trademarks of Agfa Gevaert N.V.) make use of the XTD-technology.

Preferred lithographic printing plate precursors according to the present invention produce a useful lithographic image upon image-wise exposure with IR-light having an energy density, measured at the surface of said precursor, of 200 $mJ/cm^2$ or less, more preferably of 180 $mJ/cm^2$ or less, most preferably of 160 $mJ/cm^2$ or less. With a useful lithographic image on the printing plate, 2% dots (at 200 lpi) are perfectly visible on at least 1 000 prints on paper.

Due to the heat generated during the exposure step, the hydrophobic thermoplastic polymer particles may fuse or coagulate so as to form a hydrophobic phase which corresponds to the printing areas of the printing plate. Coagulation may result from heat-induced coalescence, softening or melting of the thermoplastic polymer particles. There is no specific upper limit to the coagulation temperature of the thermoplastic hydrophobic polymer particles, however the temperature should be sufficiently below the decomposition temperature of the polymer particles. Preferably the coagulation temperature is at least 10° C. below the temperature at which the decomposition of the polymer particles occurs. The coagulation temperature is preferably higher than 50° C., more preferably above 100° C.

Development

In one embodiment of the invention the printing plate precursor, after exposure, is developed off press by means of a suitable processing liquid. In the development step, the non-exposed areas of the image-recording layer are at least partially removed without essentially removing the exposed areas, i.e. without affecting the exposed areas to an extent that renders the ink-acceptance of the exposed areas unacceptable. The processing liquid can be applied to the plate e.g. by rubbing with an impregnated pad, by dipping, immersing, (spin-)coating, spraying, pouring-on, either by hand or in an automatic processing apparatus. The treatment with a processing liquid may be combined with mechanical rubbing, e.g. by a rotating brush. The developed plate precursor can, if required, be post-treated with rinse water, a suitable correcting agent or a preservative as known in the art. During the development step, any water-soluble protective layer present is preferably also removed. Suitable processing liquids are plain water or aqueous solutions.

In a preferred embodiment of the off press development, the processing liquid is a gum solution. A suitable gum solution which can be used in the development step is described in for example EP-A 1 342 568, paragraphs [0008] to [0022] and WO 2005/111727, page 5 line 32 to page 11 line 30.

In another preferred embodiment of the off press development, the processing liquid is an alkaline aqueous solution having a pH of at least 9, preferably at least 10, more preferably at least 11, most preferably at least 12. Suitable alkaline developers which can be used are described in the EP-As 1 614 539 and 1 164 540 and the unpublished EP-A 06 114 475 (filed 2006 May 24).

The development off press is preferably carried out at temperatures of from 20 to 40° C. in automated processing units as customary in the art. The development step may be followed by a rinsing step and/or a gumming step.

In another preferred embodiment of the invention the printing plate precursor is, after exposure, mounted on a printing press and developed on-press by supplying ink and/or fountain or a single fluid ink to the precursor.

In still another preferred embodiment of the invention the development off-press, with e.g. a gum solution, wherein the non-exposed areas of the image-recording layer are partially removed, may be combined with a development on-press, wherein a complete removal of the non-exposed areas is realized.

The plate precursor may be post-treated with a suitable correcting agent or preservative as known in the art. To increase the resistance of the finished printing plate and hence to extend the run length, the layer can be heated to elevated temperatures (so called 'baking'). During the baking step, the plate can be heated at a temperature which is higher than the glass transition temperature of the thermoplastic particles, e.g. between 100° C. and 230° C. for a period of 40 minutes to 5 minutes. A preferred baking temperature is above 60° C. For example, the exposed and developed plates can be baked at a temperature of 230° C. for 5 minutes, at a temperature of 150° C. for 10 minutes or at a temperature of 120° C. for 30 minutes. Baking can be done in conventional hot air ovens or by irradiation with lamps emitting in the infrared or ultraviolet wavelength region. This baking step results in an increased resistance of the printing plate to plate cleaners, correction agents and UV-curable printing inks.

The printing plate thus obtained can be used for conventional, so-called wet offset printing, in which ink and an aqueous dampening liquid is supplied to the plate. Another suitable printing method uses so-called single-fluid ink without a dampening liquid. Suitable single-fluid inks have been described in U.S. Pat. No. 4,045,232, 4,981,517 and 6,140,392. In a most preferred embodiment, the single-fluid ink comprises an ink phase, also called the hydrophobic or oleophilic phase, and a polyol phase as described in WO 00/32705.

EXAMPLES

Preparation of the Thermoplastic Particles LX-01 and LX-02

Preparation of LX-01:

In a double-jacketed reactor of 2 liter 10.8 g of Sodium Dodecyl Sulphate (SDS Ultra Pure obtained via Alkemi BV, Lokeren, Belgium) and 1243.9 g of demineralized water was added. The reactor was flushed with nitrogen and heated up to 80° C. When the reactor content reached a temperature of 80° C., 12 g of a 5% aqueous solution of sodium persulphate ($Na_2S_2O_8$) was added. The reactor was subsequently heated for 15 minutes at 80° C., followed by dosing the monomer mixture (238.5 g of styrene and 121.5 g of acrylonitrile) during 180 minutes. Simultaneously with the monomer addition, an additional aqueous persulphate solution was added (24 g of a 5% aqueous $Na_2S_2O_8$ solution). Upon completion of the monomer addition, the reactor was heated for 30 minutes at 80° C. To reduce the amount of residual monomer a redox-initiation system was added: 1.55 gram of sodium formaldehyde sulphoxylate dihydrate (SFS) dissolved in 120 g water and 2.57 g of a 70% by weight solution of t-butyl hydroperoxide (TBHP) diluted with 22.5 g of water. The aqueous solutions of SFS and TBHP were added separately during 80 minutes. The reaction was then heated for another 10 minutes and subsequently cooled to room temperature. 100 ppm of 5-bromo-5-nitro-1,3-dioxane was added as biocide and the latex was filtered using coarse filter paper.

This resulted in a latex dispersion LX-01 with a solid content of 20.84% by weight and a pH of 3.46.

Preparation of LX-02:

In a double-jacketed reactor of 8 liter 40.0 g of sodium dodecyl sulphate (SDS Ultra Pure obtained via Alkemi BV, Lokeren, Belgium) and 5495.3 g of demineralized water was added. The reactor was flushed with nitrogen and heated up to 75° C. When the reactor content reached a temperature of 75° C., a mixture of 15.9 grams of styrene and 8.1 grams of acrylonitrile (i.e. 1.5% of the total monomer amount) was added to prepare a latex seed. After mixing for 10 minutes, to homogeneously disperse the added monomers, a part of the initiator solution (50% of the total amount of initiator) is added, i.e. 105.6 grams of a 5% aqueous sodium persulfate solution. The reactor is subsequently heated to 80° C. during 30 minutes followed by dosing a monomer mixture of 1044.1 gram of styrene and 531.9 grams of acrylonitrile during 180 minutes. Simultaneously, 105.6 grams of a 5% sodium persulfate solution was dosed, also in 180 minutes. Upon completion of the monomer addition, the reactor was heated for 30 minutes at 80° C. To reduce the amount of residual monomer a redox-initiation system was added: 6.99 gram of sodium formaldehyde sulphoxylate dihydrate (SFS) dissolved in 534 g water and 11.43 g of a 70% by weight solution of t-butyl hydroperoxide (TBHP) diluted with 100 g of water. The aqueous solutions of SFS and TBHP were added separately during 80 minutes. The reaction was then heated for another 10 minutes and subsequently cooled to room temperature. 100 ppm of 5-bromo-5-nitro-1,3-dioxane was added as biocide and the latex was filtered using coarse filter paper. This resulted in the latex dispersion LX-02 with a solid content of 20.74% by weight and a pH of 2.99.

Particle Size and Surface of the Hydrophobic Thermoplastic Particles

Two techniques were used to measure the average particle diameter of the hydrophobic thermoplastic particles, as described in the detailed description:

$Ø_{PCS}$ is the particle diameter obtained by Photon Correlation Spectroscopy. The measurements were performed according the ISO 13321 procedure (first edition, 1996 Jul. 1) with a Brookhaven BI-90 analyzer from Brookhaven Instrument Company, Holtsville, N.Y., USA.

$Ø_V$: is the volume average particle diameter obtained with hydrodynamic fractionation obtained with a PL-PSDA apparatus (Polymer Laboratories Particle Size Diameter Analyzer) from Polymer Laboratories Ltd, Church Stretton, Shropshire, UK.

From the volume particle size distribution, obtained with the PL-PSDA apparatus, the total surface of the hydrophobic thermo-plastic particles (Surface ($m^2/g$)) is calculated. These calculations have been performed with a density (ρ, ($g/cm^3$)) of the particles of 1.10 $g/cm^3$ for LX-01 and LX-02. The density of the particles LX-01 and LX-02 (skeletal density according to ASTM D3766 standard) has been measured using the gas displacement method on an Accupyc 1330 helium-pycnometer (from Micromeritics).

The calculations are based on the following formulae:

ρ=Density ($g/cm^3$)
V=Volume of 1 g particles
N=Number of particles in 1 g
S=total Surface of 1 g of particles ($m^2/g$)
$Ø_v$=Volume particle diameter (nm)
1 g of particles has a Volume (V) of $(1/\rho).10^{-6}$ $m^3$.
The Volume of 1 spherical particle$=4/3.\pi.(Ø_v/2)^3$
The number (N) of spherical particles in 1 g is therefore:

$$N = \frac{(1/\rho)\cdot 10^{-6}}{4/3\cdot\pi\cdot(Ø_v/2)^3}$$

The surface of 1 spherical particle$=4.\pi.(Ø_V/2)^2$

The total surface of 1 g spherical particles containing N particles is therefore:

$$S = \frac{(1/\rho)\cdot 10^{-6}}{4/3\cdot\pi\cdot(Ø_v/2)^3}\cdot 4\cdot\pi\cdot(Ø_v/2)^2$$

or:

$$S(\mathrm{m}^2/\mathrm{g}) = \frac{6}{\rho\cdot Ø_v(\mathrm{nm})}\cdot 10^3$$

As mentioned above, the total surfaces of the particles, as given in the examples, are calculated with the PL-PSDA apparatus, taking into account the volume distribution of the particles. As an approximation, especially for homogeneous particles, the calculations may also be performed taking into account only the volume average particle size ($Ø_V$).

In Table 2 $Ø_{PCS}$, $Ø_V$ and the total Surface of LX-01 and LX-02 are given.

TABLE 2

$Ø_{PCS}$, $Ø_V$, and total surface of LX-01 and LX-02

| | LX-01 | LX-02 |
|---|---|---|
| $Ø_{PCS}$ (nm) | 35 | 41 |
| $Ø_V$ (nm) | 32 | 35 |
| Surface ($m^2/g$) | 175 | 165 |

Preparation of the Lithographic Substrate

A 0.3 mm thick aluminum foil was degreased by spraying with an aqueous solution containing 34 g/l of NaOH at 70° C. for 6 seconds and rinsed with demineralized water for 3.6 seconds. The foil was then electrochemically grained during 8 seconds using an alternating current in an aqueous solution containing 15 g/l of HCl, 15 g/l of $SO_4^{2-}$ ions and 5 g/l of $Al^{3+}$ ions at a temperature of 37° C. and a current density of about 100 A/dm (charge density of about 800 C/dm$^2$). Afterwards, the aluminum foil was desmutted by etching with an aqueous solution containing 145 g/l of sulphuric acid at 80° C. for 5 seconds and rinsed with demineralized water for 4 seconds. The foil was subsequently subjected to anodic oxidation during 10 seconds in an aqueous solution containing 145 g/l of sulphuric acid at a temperature of 57° C. and a current density of 33 A/dm$^2$ (charge density of 330 C/dm$^2$), then washed with demineralized water for 7 seconds and post-treated for 4 seconds (by spray) with a solution containing 2.2 g/l of polyvinylphosphonic acid (PVPA) at 70° C., rinsed with demineralized water for 3.5 seconds and dried at 120° C. for 7 seconds. The support thus obtained is characterized by a surface roughness Ra of 0.35-0.4 μm (measured with interferometer NT1100) and have an anodic weight of about 4.0 g/m$^2$.

Ingredients Used in the Preparation of the Printing Plate Precursors

PAA: Polyacrylic acid from Ciba Specialty Chemicals. PAA was added to the coating solutions as a 5 wt % aqueous solution.

IR-1: Chemical formula see table 3. IR-1 was added to the coating solutions as a 1 wt % aqueous solution.

CP-1: Chemical formula see table 3. CP-1 was added to the coating solutions as a 1 wt % (50% Methanol, 50% water) solution.

CP-2: Chemical formula see table 3. CP-2 was added to the coating solutions as a solid.

CP-3: Chemical formula see table 3. CP-3 was added to the coating solutions as a solid.

CP-4: Chemical formula see table 3. CP-4 was added to the coating solutions as a solid.

Pigment: Contrast Pigment, PV Fast Violet RL from Clariant (20% aqueous dispersion).

HEDP: 1-hydroxyethylidene-1,1-diphosphonic acid from Solutia. HEDP was added to the coating solutions as a 10% by weight aqueous solution.

FSO 100: Zonyl FSO 100, a perfluorinated surfactant from Dupont.

TABLE 3 chemical structure of the IR-1, CP-01 to CP-04

| IR Dye | Chemical Structure |
|---|---|
| IR-1 | 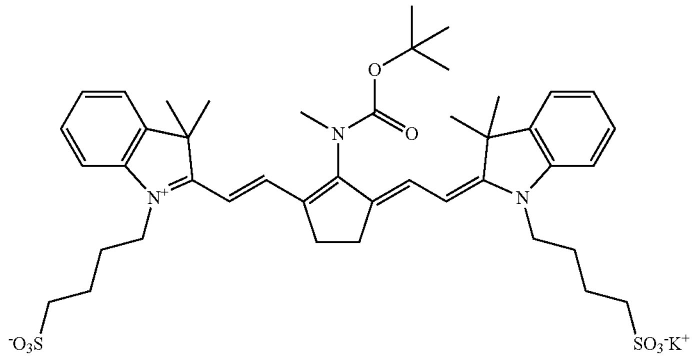 |
| CP-1 | 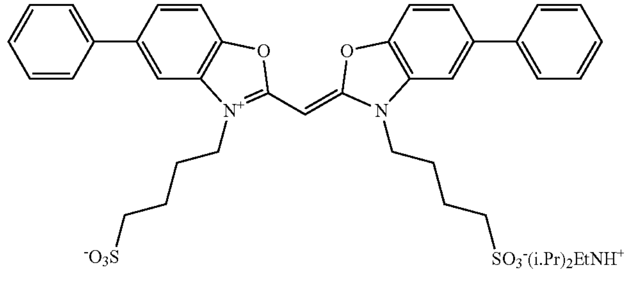 |

TABLE 3-continued chemical structure of the IR-1, CP-01 to CP-04

| IR Dye | Chemical Structure |
|---|---|
| CP-2 | 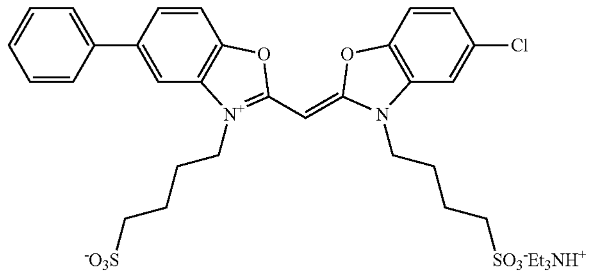 |
| CP-3 | 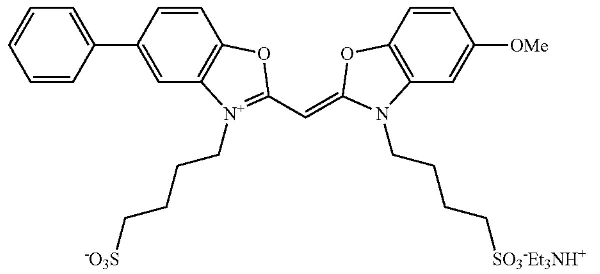 |
| CP-4 | 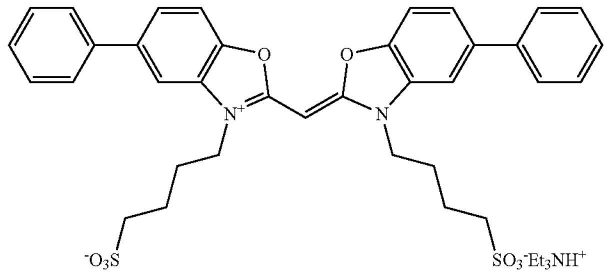 |

Me = methyl, Et = ethyl, i.Pr = isopropyl.

Example 1

Printing Plate Precursors PPP-1 to PPP-7

Preparation of the Coating Solutions

The coating solutions for the printing plate precursors 1 to 7 were prepared using the solutions, solids or dispersions as described above. The latex dispersion LX-01 or LX-02 was added to demineralized water followed by stirring for 10 minutes. Subsequently the IR-dye (IR-1) was added. After another 10 minutes the compounds according to the present invention (CP-01 to CP-04) and the contrast pigment, if any, were added. After 60 minutes of stirring the polyacrylic acid (PAA) solution was added. After 10 minutes of stirring the HEDP solution was added and subsequently after another 10 minutes of stirring the surfactant solution was added and the coating dispersion was stirred for another 30 minutes. Subsequently the pH was adjusted to a value of 3.6 with a diluted ammonia solution (ca 3%).

Preparation of the Printing Plate Precursors PPP-01 to PPP-07

The printing plate precursor coating solutions were subsequently coated on the aluminum substrate as described above with a coating knife at a wet thickness of 30 μm. The coatings were dried at 60° C. Table 4 lists the resulting dry coating weight of the different components of the printing plate precursors.

TABLE 4 dry coating weight (g/m$^2$) of ingredients of PPP-01 to PPP-07

| | PPP | | | | | | |
|---|---|---|---|---|---|---|---|
| | PPP-01 (COMP) | PPP-02 (INV) | PPP-03 (INV) | PPP-04 (INV) | PPP-05 (INV) | PPP-06 (INV) | PPP-07 (INV) |
| LX-01 | 0.540 | 0.540 | 0.540 | 0.540 | 0.540 | 0.540 | 0.540 |
| IR-01 | 0.078 | 0.078 | 0.078 | 0.078 | 0.078 | 0.078 | 0.078 |
| CP-01 | — | 0.016 | 0.032 | — | — | — | — |
| CP-02 | — | — | — | 0.016 | 0.032 | — | — |
| CP-03 | — | — | — | — | — | 0.016 | 0.032 |

TABLE 4-continued dry coating weight (g/m²) of ingredients of PPP-01 to PPP-07

| | PPP | | | | | | |
|---|---|---|---|---|---|---|---|
| | PPP-01 (COMP) | PPP-02 (INV) | PPP-03 (INV) | PPP-04 (INV) | PPP-05 (INV) | PPP-06 (INV) | PPP-07 (INV) |
| PAA | 0.065 | 0.065 | 0.065 | 0.065 | 0.065 | 0.065 | 0.065 |
| HEDP | 0.030 | 0.030 | 0.030 | 0.030 | 0.030 | 0.030 | 0.030 |
| FSO 100 | 0.005 | 0.005 | 0.005 | 0.005 | 0.005 | 0.005 | 0.005 |
| Sum ingredients | 0.718 | 0.734 | 0.750 | 0.734 | 0.750 | 0.734 | 0.750 |

Exposure and Printing of Printing Plate Precursors PPP-01 to PPP-07

The printing plate precursors were then exposed on a Creo TrendSetter 3244 (trademark of CREO) 40 W fast head IR-laser plate-setter at 210-180-150-120-90 mJ/cm$^2$ at 150 rotations per minute (rpm) with a 200 line per inch (lpi) screen and an adressability of 2400 dpi. These exposed printing plate precursors were directly mounted on a GTO52 printing press, equipped with a VARN Kompac III dampening system, without any processing or pretreatment. A compressible blanket was used and printing was done with a 4% Emerald Premium 3520 fountain solution (trademark of Anchor) and K+E 800 black ink (trademark of K&E). The following start-up procedure was used: first 5 revolutions with the dampening form rollers engaged, then 5 revolutions with both the dampening and ink form rollers engaged, then start printing. 1000 prints were made on 80 g offset paper.

Evaluation of the Printing Plate Precursors PPP-01 to PPP-07

The printing plate precursors are evaluated by the following characteristics:

Sensitivity 1: the lowest exposure energy density at which 2% dots (200 lpi) are visible (by means of a 5× magnifying glass) on the 1000$^{th}$ print on paper.

Sensitivity 2: the interpolated energy density value where the surface coverage (calculated from the measured optical density of the 1000$^{th}$ print on paper) of a B-25 2% dot patch equals 55%. A B-25 2% dot patch consists of 2% ABS (200 lpi, 2400 dpi) dots, but the total surface coverage of these dots is 25%. ABS dots are generated with Agfa Balanced Screening software (trademark of Agfa-Gevaert NV).

Clean-out 1: The number of prints needed to obtain an optical density in the non-image areas of the plate (Dmin) of ≦0.005. A good working plate should have a value of less than 25 prints in order to achieve good clean-out.

Clean-out 2: After 750 prints, the paper sheet size is shortened and printing is continued for another 250 prints. After 1 000 prints, a few more prints are generated on the normal paper size. If any staining should occur, this will result in an accumulation of ink on the blanket, while printing is performed with the shortened paper size. This accumulated ink will then be transferred to the paper when the normal paper size is used again, after 1000 prints. This method allows for a very precise evaluation of the stain level. A value of 5.0 means no stain is observed at all after 1000 prints. A value of 4.0 would be barely acceptable. A value of 3.0 would be totally unacceptable for high quality print jobs.

Optical Densities are measured with a GretagMacbeth densitometer Type D19C.

In table 5 the lithographic properties are given together with the following characteristics of the lithographic printing plate precursors:

IR/Surf (mg/m$^2$): The amount of IR-dye (mg), without taken into account the counter ion, per m$^2$ of the total surface of the particles.

IR+CP/Surf (mg/m$^2$): Total amount of IR-dye and the compound (CP) according to this invention, without taking into account counter ions, per m$^2$ of the total surface of the particles.

TABLE 5 lithographic evaluation PPP-01 to PPP-07

| | PPP | | | | | | |
|---|---|---|---|---|---|---|---|
| | PPP-01 (COMP) | PPP-02 (INV) | PPP-03 (INV) | PPP-04 (INV) | PPP-05 (INV) | PPP-06 (INV) | PPP-07 (INV) |
| IR/Surf | 0.78 | 0.78 | 0.78 | 0.78 | 0.78 | 0.78 | 0.78 |
| IR + CP/Surf | 0.78 | 0.92 | 1.08 | 0.93 | 1.08 | 0.93 | 1.08 |
| Sensitivity 1 | 150 | 150 | 120 | 150 | 150 | 150 | 120 |
| Sensitivity 2 | 150 | 158 | 120 | 150 | 185 | 188 | 160 |
| Clean out 1 | >1000 | 5 | 5 | 1 | 1 | 1 | 1 |
| Clean out 2 | 3 | 4.5 | 4.5 | 4.5 | 5.0 | 4.5 | 4.5 |

From the results shown in table 5 can be concluded:

When no compounds according to the present invention are present in the image-recording layer, a bad clean-out is observed (comparative example PPP-01).

When compounds according to the present invention are present in the image-recording layer, a good clean-out and a high sensitivity is observed (invention examples PPP-02 to PPP-07).

Example 2

Printing Plate Precursors PPP-08 to PPP-10

Preparation of the Printing Plate Precursors PPP-08 to PPP-10

The preparation of the printing plate precursors were performed as described in example 1. Table 6 lists the resulting dry coating weight of the different components of the printing plate precursors.

TABLE 6 dry coating weight (g/m²) of ingredients of PPP-08 to PPP-10

| | PPP | | |
|---|---|---|---|
| | PPP-08 (COMP) | PPP-09 (INV) | PPP-10 (INV) |
| LX-01 | 0.540 | 0.540 | 0.540 |
| IR-01 | 0.078 | 0.078 | 0.078 |
| CP-04 | — | 0.016 | 0032 |
| PAA | 0.065 | 0.065 | 0.065 |
| HEDP | 0.030 | 0.030 | 0.030 |
| FSO 100 | 0.005 | 0.005 | 0.005 |
| Sum ingredients | 0.718 | 0.734 | 0.750 |

Exposure, Development, Printing and Evaluation of the Printing Plate Precursors PPP-08 to PPP-10

Exposure, development, printing and evaluation of the printing plate precursors PPP-08 to PPP-10 were performed as described in example 1.

In table 7 the lithographic properties of the printing plate precursors PPP-08 to PPP-10 are shown.

TABLE 7 lithographic evaluation of PPP-08 to PPP-10

| | PPP | | |
|---|---|---|---|
| | PPP-08 (COMP) | PPP-09 (INV) | PPP-10 (INV) |
| IR/Surf | 0.78 | 0.78 | 0.78 |
| IR + CP/Surf | 0.78 | 0.93 | 1.08 |
| Sensitivity 1 | 150 | 150 | 150 |
| Sensitivity 2 | 175 | 145 | 175 |
| Clean out 1 | 100 | 1 | 1 |
| Clean out 2 | 4 | 5 | 5 |

From the results shown in table 7 can be concluded:

When no compounds according to the present invention are present in the image-recording layer, a bad clean-out is observed (comparative example PPP-08).

When compounds according to the present invention are present in the image-recording layer, a good clean-out and a high sensitivity is observed (invention examples PPP-09 and PPP-10).

Example 3

Printing Plate Precursors PPP-11 to PPP-14

The preparation of the printing plate precursors were performed as described in example 1. Table 8 lists the resulting dry coating weight of the different components of the printing plate precursors.

TABLE 8 dry coating weight (g/m²) of ingredients of PPP-11 to PPP-14

| | PPP | | | |
|---|---|---|---|---|
| | PPP-11 (COMP) | PPP-12 (COMP) | PPP-13 (INV) | PPP-14 (INV) |
| LX-02 | 0.55 | 0.55 | 0.55 | 0.55 |
| IR-01 | 0.05 | 0.05 | 0.05 | 0.05 |
| Pigment | — | 0.02 | — | 0.02 |
| CP-04 | — | — | 0.01 | 0.01 |
| PAA | 0.046 | 0.046 | 0.046 | 0.046 |
| HEDP | 0.015 | 0.015 | 0.015 | 0.015 |
| FSO 100 | 0.005 | 0.005 | 0.005 | 0.005 |
| Sum ingredients | 0.666 | 0.686 | 0.686 | 0.706 |

Exposure, Development, Printing and Evaluation of the Printing Plate Precursors PPP-11 to PPP-14.

The printing plate precursors were exposed on a Creo Trend-Setter 3244 40 W fast head IR-laser plate-setter at 210-180-150-120-90 mJ/cm² at 150 rotations per minute (rpm) with a 200 line per inch (lpi) screen and an addressability of 2400 dpi.

After exposure the printing plate precursors were developed in a VA-88 processor (from Agfa Gevaert NV) with a TD1000 developer (from Agfa-Gevaert NV) followed by gumming using a gum solution prepared as follows:

To 700 ml demineralized water 77.3 ml Dowfax 3B2 (commercially available from Dow Chemical)

32.6 g of trisodium citrate dihydrate 9.8 g citric acid monohydrate were added whilst stirring demineralized water was further added to obtain 1000 g gum solution.

After development and gumming the printing plates were mounted on a GTO46 printing press. A compressible blanket was used and printing was done with the fountain Agfa Prima FS101 (trademark of Agfa) and K+E 800 black ink (trademark of K&E). The following start-up procedure was used: first 5 revolutions with the dampening form rollers engaged, then 5 revolutions with both the dampening and ink form rollers engaged, then printing started. 1000 prints were made on 80 g offset paper.

Evaluation of the Printing Plate Precursors PPP-11 to PPP-14.

Evaluation of the printing plate precursors PPP-11 to PPP-14 were performed as described in example 1.

In table 9 the lithographic properties of the printing plate precursors PPP-11 to PPP-14 are shown.

TABLE 9 lithographic evaluation of PPP-11 to PPP-14

| | PPP | | | |
|---|---|---|---|---|
| | PPP-11 (COMP) | PPP-12 (COMP) | PPP-13 (INV) | PPP-14 (INV) |
| IR/Surf | 0.53 | 0.53 | 0.53 | 0.53 |
| IR + CP/Surf | 0.53 | 0.53 | 0.72 | 0.72 |
| Sensitivity 1 | 150 | 150 | 150 | 150 |
| Sensitivity 2 | 210 | 200 | 180 | 200 |
| Clean out 2 | 4 | 3.5 | 5 | 5 |

From the results shown in table 9 can be concluded:

When no compounds according to the present invention are present in the image-recording layer, a bad clean-out is observed (comparative examples PPP-11 and PPP-12).

When compounds according to the present invention are present in the image-recording layer, a good clean-out and a high sensitivity is observed (invention examples PPP-13 and PPP-14).

We claim:

1. A heat-sensitive negative-working lithographic printing plate precursor comprising:

(a) a support having a hydrophilic surface or which is provided with a hydrophilic layer; and (b) an image-recording layer comprising hydrophobic thermoplastic polymer particles and an infrared light absorbing dye;

wherein said image-recording layer further comprises a compound, wherein the compound is a cyanine dye according to Formula I-e:

Formula I-e

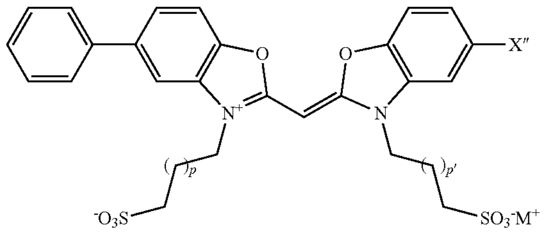

wherein p and p' are integers ranging from 0 to 3;

X" represents H, O—$CH_3$, chloride or phenyl; and $M^+$ is a monovalent counter ion.

2. A method for making a lithographic printing plate comprising the steps of:

(a) providing a printing plate precursor;

(b) exposing said printing plate precursor to infrared light; and (c) developing said exposed printing plate precursor with an alkaline aqueous solution;

wherein said printing plate precursor comprises:

(i) a support having a hydrophilic surface or which is provided with a hydrophilic layer; and (ii) an image-recording layer comprising hydrophobic thermoplastic polymer particles and an infrared light absorbing dye;

wherein said image-recording layer further comprises a compound, the compound comprising an aromatic moiety and at least one acidic group or salt thereof and having a most bathochromic light absorption peak at a wavelength between 300 nm and 450 nm, wherein the sum of the amounts of the infrared light absorbing dye and the compound, without taking into account optional counter ions, is more than 0.80 mg per $m^2$ of the total surface of the particles, wherein the surface is measured by Hydrodynamic Fractionation.

3. A method for making a lithographic printing plate comprising the steps of:

(a) providing a printing plate precursor;

(b) exposing said printing plate precursor to infrared light; and (c) developing said exposed printing plate precursor with an alkaline aqueous solution;

wherein said printing plate precursor comprises:

(i) a support having a hydrophilic surface or which is provided with a hydrophilic layer; and (ii) an image-recording layer comprising hydrophobic thermoplastic polymer particles and an infrared light absorbing dye;

wherein said image-recording layer further comprises a compound, wherein the compound is a cyanine dye or an azacyanine dye according to Formulae I-c or I-d:

Formula I-c

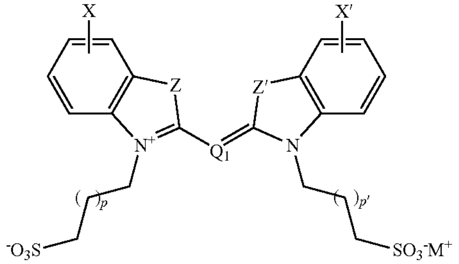

Formula I-d

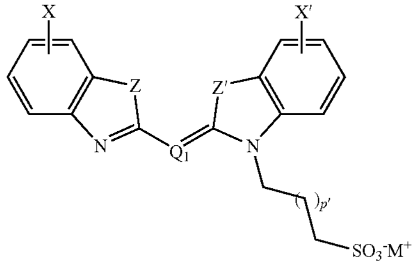

wherein p and p' are integers ranging from 0 to 3;

$Q_1$ is CH or N;

X and X' independently are hydrogen, a halogen, O—$CH_3$, an optionally substituted alkyl or (hetero) aryl group or a condensed benzene ring;

Z and Z' independently are O, NR', S, $C(CH_3)_2$ or CH═CH wherein R' is an optionally substituted alkyl or (hetero) aryl group; and $M^+$ is a monovalent counter ion, wherein the sum of the amounts of the infrared light absorbing dye and the compound, without taking into account optional counter ions, is more than 0.80 mg per $m^2$ of the total surface of the particles, wherein the surface is measured by Hydrodynamic Fractionation.

4. A method for making a lithographic printing plate comprising the steps of:

(a) providing a printing plate precursor;

(b) exposing said printing plate precursor to infrared light; and (c) developing said exposed printing plate precursor with an alkaline aqueous solution;

wherein said printing plate precursor comprises:

(i) a support having a hydrophilic surface or which is provided with a hydrophilic layer; and (ii) an image-recording layer comprising hydrophobic thermoplastic polymer particles and an infrared light absorbing dye;

wherein said image-recording layer further comprises a compound, the compound comprising an aromatic moiety and at least one acidic group or salt thereof and having a most bathochromic light absorption peak at a wavelength between 300 nm and 450 nm, wherein the acidic group is selected from the group consisting of a substituted sulphonamido-based acid group; a carboxylic acid group; a sulphonic acid group; a dithiosulphonic acid group; a sulphuric acid group; a phosphoric acid group; and a phosphonic acid wherein the sum of the amounts of the infrared light absorbing dye and the compound, without taking into account optional counter ions, is more than 0.80 mg per $m^2$ of the total surface of the particles, the surface is measured by Hydrodynamic Fractionation.

* * * * *